(12) United States Patent
Liu et al.

(10) Patent No.: US 7,348,900 B1
(45) Date of Patent: Mar. 25, 2008

(54) METHOD AND APPARATUS FOR ENCODING/DECODING IN FIXED LENGTH

(75) Inventors: Pi-Hai Liu, Taipei (TW); Ming-Yang Chao, Hsin-Chu Hsien (TW); Jin-Bin Yang, Changhua County (TW)

(73) Assignee: MediaTek Inc., Hsin-Chu Hsien (TW)

( * ) Notice: Subject to any disclaimer, the term of this patent is extended or adjusted under 35 U.S.C. 154(b) by 58 days.

(21) Appl. No.: 11/308,095

(22) Filed: Mar. 7, 2006

(51) Int. Cl.
*H03M 5/00* (2006.01)
(52) U.S. Cl. .......................... 341/58; 341/59; 375/253
(58) Field of Classification Search ............ 341/58–59; 375/253
See application file for complete search history.

(56) References Cited

U.S. PATENT DOCUMENTS

| | | | |
|---|---|---|---|
| 6,172,622 B1 * | 1/2001 | Nakagawa et al. | 341/59 |
| 6,496,541 B1 | 12/2002 | Kahlman et al. | |
| 6,686,855 B2 * | 2/2004 | Hayami et al. | 341/59 |
| 6,690,308 B2 * | 2/2004 | Hayami | 341/68 |
| 6,879,637 B1 * | 4/2005 | Nakagawa et al. | 375/253 |
| 6,950,042 B2 * | 9/2005 | Nakagawa et al. | 341/58 |
| 2003/0184456 A1 | 10/2003 | Hayami et al. | |
| 2004/0130467 A1 * | 7/2004 | Nakagawa et al. | 341/58 |

* cited by examiner

*Primary Examiner*—Khai M. Nguyen
(74) *Attorney, Agent, or Firm*—Winston Hsu

(57) ABSTRACT

A modulation method for a first data string having a plurality of symbols is disclosed. The method includes: appending a data string to the first data string to form a second data string; and converting the second data string to a code word sequence by converting each of the symbols in the first data string to a code word according to predetermined modulation rules and a symbol set selected from the second data string. Each code word has a first fixed number of bits, each symbol has a second fixed number of bits, and each symbol set has a fixed number of symbols.

23 Claims, 9 Drawing Sheets

| Data | Code |
|---|---|
| 11 | *0* |
| 10 | 001 |
| 01 | 010 |
| 0011 | 010 100 |
| 0010 | 010 000 |
| 0001 | 000 100 |
| 000011 | 000 100 100 |
| 000010 | 000 100 000 |
| 000001 | 010 100 100 |
| 000000 | 010 100 000 |
| "110111 | 001 000 000 (next 010) |
| 00001000 | 000 100 100 100 |
| 00000000 | 010 100 100 100 | if xx1 then *0*=000
  xx0 then *0*=101
sync & Termination
01 000 000 001  (12 channel bits)
or
01 001 000 000 001 000 000 001  (24 channel bits)
=0:   Not terminate case
=1:   Terminate case

---

Termination Table

| | | |
|---|---|---|
| 00 | 000 | |
| 0000 | 010 | 100 |
| "110111 | 001 000 000 (next 010) | |

Fig. 1 Related Art

| Code word string | Demodulated data string |
|---|---|
| i=1  101 | 11 |
| 000 | 11 |
| 001 | 10 |
| 010 | 01 |
| i=2  010 100 | 0011 |
| 010 000  (not 100) | 0010 |
| 000 100 | 0001 |
| i=3  000 100 100 | 000011 |
| 000 100 000  (not 100) | 000010 |
| 010 100 100 | 000001 |
| 010 100 000  (not 100) | 000000 |
| i=3:Prohibit minimum transition run length | |
| 001 000 000  (not 100) | 110111 |
| i=4:Limits k to 7 | |
| 000 100 100 100 | 00001000 |
| 010 100 100 100 | 00000000 |

Fig. 2 Related Art

Conversion table

| P Q R | | X₁ X₂ X₃ | | | |
|---|---|---|---|---|---|
| CV=0 | 01 → | 0 | 1 | 0 | ,CV=0 |
|  | 10 → | 0 | 0 | 1 | ,CV=0 |
|  | 11 → | 1 | 0 | 1 | ,CV=0 |
| CV=0 | 00.01 → | 0 | 0 | 0 | ,CV=1 |
|  | 00.10 → | 0 | 1 | 0 | ,CV=1 |
|  | 00.11 → | 0 | 1 | 0 | ,CV=1 |
| CV=0 | 00.00.00 → | 0 | 0 | 0 | ,CV=1 |
|  | 00.00.01 → | 1 | 1 | 0 | ,CV=1 |
|  | 00.00.10 → | 0 | 0 | 0 | ,CV=1 |
|  | 00.00.11 → | 1 | 0 | 0 | ,CV=1 |
| CV=1 | 00 → | 1 | 0 | 0 | ,CV=2 |
|  | 01 → | 1 | 0 | 0 | ,CV=0 |
|  | 10 → | 0 | 0 | 0 | ,CV=0 |
|  | 11 → | 1 | 0 | 0 | ,CV=0 |
| CV=2 | 01 → | 1 | 0 | 0 | ,CV=0 |
|  | 11 → | 1 | 0 | 0 | ,CV=0 |
| CV=2 | 10.00 → | 1 | 0 | 0 | ,CV=3 |
|  | 10.00 → | 0 | 0 | 0 | ,CV=0 |
| CV=2 | 00.00 → | 1 | 0 | 0 | ,CV=3 |
|  | 00.00 → | 0 | 0 | 0 | ,CV=0 |
| CV=3 | 00 → | 1 | 0 | 0 | ,CV=0 |

Fig. 4

Inverse conversion table

| A | B | C | D | E | M₁ | M₂ |
|---|---|---|---|---|---|---|
|   |   | 010 | 101 | -> | 0 | 1 |
|   |   |     | 001 |    |   |   |
|   |   |     | 010 |    |   |   |
|   |   | 010 | 100 | -> | 0 | 0 |
|   |   | 010 | 000 | 100 -> | 0 | 1 |
|   |   | 010 | 000 | 100 -> | 0 | 0 |
|   |   | 000 | 100 | -> | 0 | 0 |
|   | 001 | 000 | 100 | -> | 1 | 1 |
|   | 101 |     |     |    |   |   |
|   | 010 | 000 | 100 | -> | 1 | 0 |
|   | 000 | 000 | 100 | -> | X |   |
| 010 | 100 | 000 | 100 | -> | 0 | 0 |
| 000 | 100 | 000 | 100 | -> | 1 | 0 |
|   |   | 101 | -> |    | 1 | 1 |
|   |   | 001 | -> |    | 1 | 0 |
|   | 010 | 100 | 010 | -> | 1 | 1 |
|   |     |     | 001 |    |   |   |
|   |     |     | 101 |    |   |   |
|   | 000 | 100 | 010 | -> | 0 | 1 |
|   |     |     | 001 |    |   |   |
|   |     |     | 101 |    |   |   |
|   | 010 | 100 | 000 | 100 -> | 1 | 1 |
|   | 000 | 100 | 000 | 100 -> | 0 | 1 |
|   | 100 | 100 | 000 | 100 -> | 0 | 0 |
|   | 100 | 100 | 100 | -> | 1 | 0 |
| 000 | 100 | 100 | 100 | -> | 1 | 1 |
| 010 | 100 | 100 | 100 | -> | 0 | 1 |
| 000 | 100 | 100 | 100 | -> | 1 | 0 |
| 010 | 100 | 100 | 100 | -> | 0 | 0 |
| 100 | 100 | 100 |     | -> | 0 | 0 |

Fig. 7

Inverse conversion table

| A | B | C | D | E | F | M1 | M2 |
|---|---|---|---|---|---|----|----|
|   |   | 010 | 101 | -> |   | 0 | 1 |
|   |   |   | 001 |   |   |   |   |
|   |   |   | 010 |   |   |   |   |
|   |   | 010 | 100 | -> |   | 0 | 0 |
|   |   | 010 | 000 | 100 | -> | 0 | 1 |
|   |   | 010 | 000 | 100 | -> | 0 | 0 |
|   |   | 000 | 100 | -> |   | 0 | 0 |
|   | 001 | 000 | 010 | -> |   | 1 | 1 |
|   |   |   | 001 |   |   |   |   |
|   |   |   | 101 |   |   |   |   |
|   | 001 | 000 | 000 | 010 | -> | 0 | 1 |
|   | 001 | 000 | 000 | 010 | -> | 1 | 1 |
|   | 101 | 000 | 100 | -> |   | 1 | 1 |
|   | 010 | 000 | 100 | -> |   | 1 | 0 |
| 001 | 000 | 000 | 010 | -> |   | 1 | 1 |
| 010 | 100 | 000 | 100 | -> |   | 0 | 0 |
| 000 | 100 | 000 | 100 | -> |   | 1 | 0 |
|   |   | 101 | -> |   |   | 1 | 1 |
|   | 001 | 000 | 000 | 010 | ->1 | 1 |
|   | 001 | 000 | 000 | 010 | ->1 | 0 |
|   | 010 | 100 | 010 | -> |   | 1 | 1 |
|   |   |   | 001 |   |   |   |   |
|   |   |   | 101 |   |   |   |   |
|   | 000 | 100 | 010 | -> |   | 0 | 1 |
|   |   |   | 001 |   |   |   |   |
|   |   |   | 101 |   |   |   |   |
|   | 010 | 100 | 000 | 100 | -> | 1 | 1 |
|   | 000 | 100 | 000 | 100 | -> | 0 | 1 |
|   | 100 | 100 | 000 | 100 | -> | 0 | 0 |
|   | 100 | 100 | 100 | -> |   | 0 | 0 |
| 000 | 100 | 100 | 100 | -> |   | 1 | 1 |
| 010 | 100 | 100 | 100 | -> |   | 0 | 1 |
| 000 | 100 | 100 | 100 | -> |   | 1 | 0 |
| 010 | 100 | 100 | 100 | -> |   | 0 | 0 |
| 100 | 100 | 100 |   | -> |   | 0 | 0 |

Fig. 9

METHOD AND APPARATUS FOR ENCODING/DECODING IN FIXED LENGTH

BACKGROUND

The present invention relates to a method for encoding and decoding data, and more particularly, to a method and related apparatus of encoding and decoding fixed bit length data string to generate fixed bit length data string.

Data in the form of 1's and 0's is often referred to as a data string. This data string must be modulated and demodulated as part of the process for storing the data on optical disc. Block encoding is a popular technique utilized for the modulation and demodulation task. Block encoding utilizes a data string that is blocked into units with each unit containing some number of bits of data. These blocks of data are typically referred to as data words. Data words that have been encoded are then referred to as code words.

Variable length encoding, as the name implies, utilizes some portion of the data string to form a block. The process for block encoding of data strings is well known in the art. For instance, the industry's conventional coding method and apparatus employed with the Blu-Ray disc format is known as 17PP. The 17PP-coding scheme generates code words that must follow certain rules, such that the number of consecutive zeros between two ones is not less than 1 and not greater than 7, and the code sequence "10" can be repeated at most 6 times.

Please refer to FIG. 1 and FIG. 2. FIG. 1 is a conversion table for encoding according to the related art. FIG. 2 is an inverse conversion table for decoding according to the related art. The conventional conversion table for encoding contains codes for basic encoding codes, substitution codes, and termination codes. Basic codes are those codes that simply encode a data string into a code string, for example, referring to the table shown in FIG. 1, a related art encoding using 17PP-coding scheme for the data string "0011" encodes to code string "010 100". Substitution codes and termination codes are also required to successfully complete the conversation from raw data to encoded data. In order to get back (i.e., restore) the original raw data, a decoding process is required. That is, the decoding process is used to convert encoded data into original raw data by referring to the table shown in FIG. 2. The coding scheme has been detailed in U.S. Pat. No. 6,496,541 and U.S. patent application publication No. 2003/0184456. For brevity, a detailed description related to the 17PP-coding scheme is omitted here.

As shown in FIG. 1 and FIG. 2, the fetched data is of variable length, and the code words generated are of variable length. In other words, the conventional encoding/decoding conversion tables for the 17PP-coding scheme are used for processing data words and code words, but in the related art, these are all of variable length. Therefore, the conventional variable length encoding/decoding method is inefficient to implement for several reasons, including: utilizing variable length data with which to generate variable length code words requires complex conversion tables and complex substitution rules. These complexities are more difficult to implement and require greater processing resources.

SUMMARY

It is therefore one of the objectives of the claimed invention to provide a fixed length approach to encode and decode data, to solve the problems described above.

According to an embodiment of the claimed invention, a modulation method for a first data string having a plurality of symbols is disclosed. The method comprises: appending a data string to the first data string to form a second data string; and converting the second data string to a code word sequence by converting each of the symbols in the first data string to a code word according to predetermined modulation rules and a symbol set selected from the second data string. Each code word has a first fixed number of bits, each symbol has a second fixed number of bits, and each symbol set has a fixed number of symbols.

According to another embodiment of the claimed invention, a demodulation method for a code word stream disposed between a first synchronization pattern and a second synchronization pattern is disclosed. The method comprises: identifying a plurality of code words in the code word stream; and converting each of the code words into a symbol according to predetermined demodulation rules and a code word set selected from the code word stream. Each code word has a first fixed number of bits, each symbol has a second fixed number of bits, and each code word set has a fixed number of code words.

In addition, a modulation apparatus for a first data string having a plurality of symbols is disclosed. The modulation apparatus comprises: an appending unit for appending a data string to the first data string to form a second data string; and a converting unit coupled to the appending unit for converting each of the symbols in the first data string into a code word according to predetermined modulation rules and a symbol set selected from the second data string. Each code word has a first fixed number of bits, each symbol has a second fixed number of bits, and each symbol set has a fixed number of symbols.

Furthermore, a demodulation apparatus for a code word stream disposed between a first synchronization pattern and a second synchronization pattern is disclosed. The demodulation apparatus comprises: an identifying unit for identifying a plurality of code words in the code word stream; and a converting unit coupled to the identifying unit for converting each of the code words into a symbol according to predetermined demodulation rules and a code word set selected from the code word stream. Each code word has a first fixed number of bits, each symbol has a second fixed number of bits, and each code word set has a fixed number of code words.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 is a conversion table for encoding according to the related art.

FIG. 2 is an inverse conversion table for decoding according to the related art.

FIG. 4 is a conversion table for encoding according to an embodiment of the present invention.

FIG. 7 is an inverse conversion table for decoding according to an embodiment of the present invention.

FIG. 9 is an inverse conversion table for decoding according to another embodiment of the present invention.

DETAILED DESCRIPTION

Preferred embodiments of the present invention are described as follows.

In the preferred embodiments, bits are binary digits. A bit can be of value "1" or "0". A stream of bits forms a bit stream, for example, this is a random bit stream: 000100100. The bit stream can be a stream of data bits or a stream of coded bits. Data bits forming a data string are bits that have not yet been encoded or coded bits that were once encoded but are now decoded. Coded bits are bits that were once data bits but have now already been coded. The code word mentioned below complies with a Blu-ray disc format specification. That is, each code word is a 17PP-coding scheme code.

Figure 3:
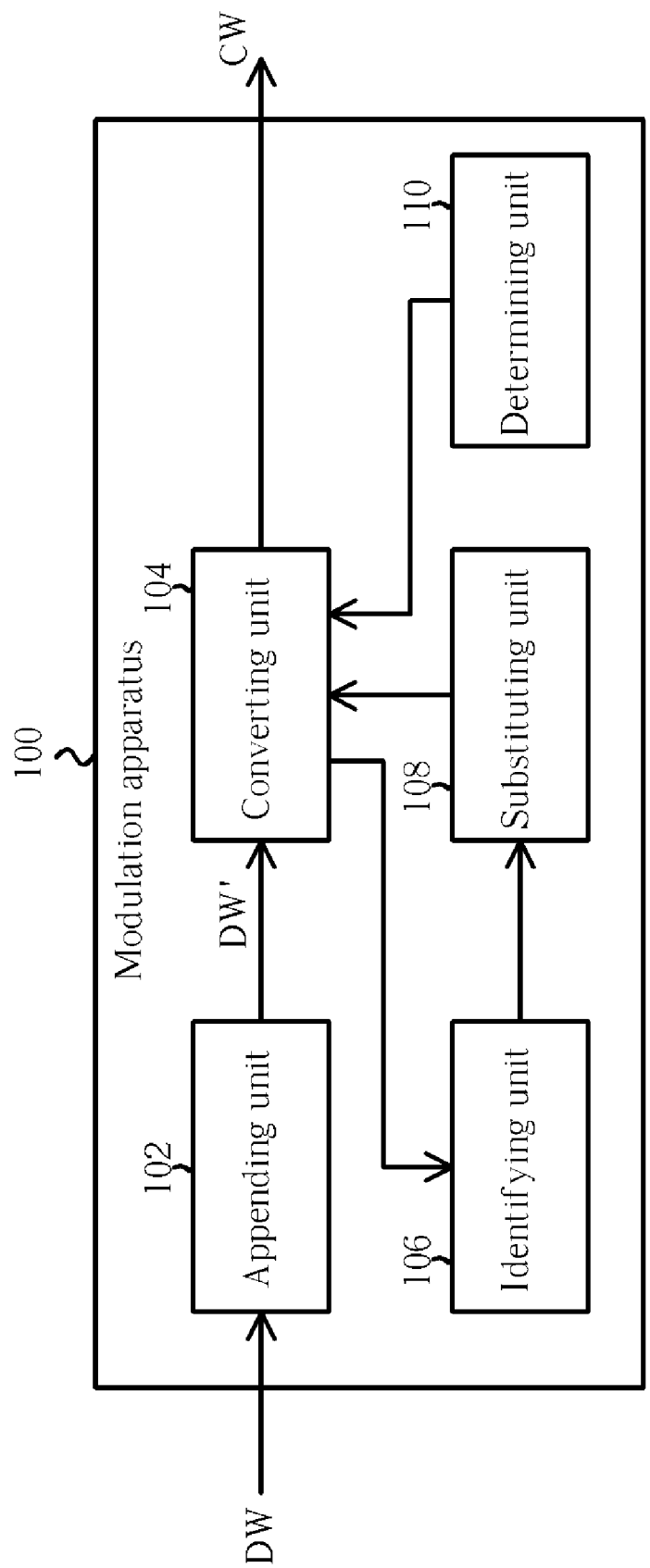
FIG. 3 is a block diagram of a modulation apparatus according to a first embodiment of the present invention.

Please refer to FIG. 3. FIG. 3 is a block diagram of a modulation apparatus 100 according to a first embodiment of the present invention. The modulation apparatus 100 has an appending unit 102, a converting unit 104, an identifying unit 106, a substituting unit 108, and a determining unit 110. The appending unit 102 is used for appending a data string, "0101" or "0100", to the incoming data word sequence DW to form a modified data word sequence DW'. The converting unit 104 is used for converting each of the symbols in the data word sequence DW into a code word according to predetermined modulation rules and a symbol set selected from the data word sequence DW'. In this embodiment, each code word has three bits, each symbol has two bits, and each symbol set has three successive symbols. This is an example used for the preferred embodiment and is not a limitation of the present invention. The present invention will work with random symbols or successive symbols.

The identifying unit 106 is used for identifying first the predetermined patterns, "101 010 101 010" and "xx1 101" (x means that the value can be 0 or 1), in the code words generated by the converting unit 104. The substituting unit 108 is used for substituting the above-listed first predetermined patterns with second predetermined patterns. For example, "101 010 101 010" is replaced with "001 000 00 010" and "xx1 101" is replaced with "xx1 000". The modulation apparatus 100 is capable of converting a received data stream into an encoded data stream. In addition, in a predetermined position, a specified synchronization pattern is added to the encoded data stream. In this embodiment, the code word sequence CW generated by encoding the inputted data word sequence DW is sandwiched by two synchronization patterns. When a last symbol of the data word sequence DW has been converted by the converting unit 104, the determining unit 110 determines the first bit of the synchronization pattern appended to the code word sequence CW according to a control value CV. Please note that a predetermined portion (e.g., one or more bits) of the synchronization pattern can be utilized just as easily as the first bit as used in this embodiment as an example and not a limitation.

Please refer to FIG. 4, which is a conversion table for encoding according to an embodiment of the present invention. Based on this table, the converting unit 104 follows predetermined modulation rules to perform the encoding operation. The following description details the notation utilized by said conversion table. A complete understanding of this notation is needed before presenting an example of data word to code word encoding. The encoding table notation is as follows. A symbol 00 shown in underscore notation represents symbols that are not equal to 00. In other words, 00 in underscore notation can be any one of the following: 01, 10, or 11. Symbols P, Q and R are each 2-bit data word symbols successively transmitted via the data word sequence DW. Each of these symbols P, Q, and R is to be encoded into a 3-bit code word. Taking the symbol P for example, it is encoded into a code word having three bits: $X_1$, $X_2$ and $X_3$. Furthermore, the symbol P is considered the active data word that is currently being encoded. P is also called the target symbol, in other words, the symbol currently being encoded. That is, as the converting unit 104 is processing the symbol P, the next two symbols Q and R are referenced. Once the encoding of symbol P is completed, both the symbols Q and R shift their positions in the data word sequence DW such that the unprocessed symbols Q and R shift into new positions to become the symbols P and Q. The next new unprocessed data symbol in the data word sequence DW now occupies the position for symbol R. Please note that by way of example and not as a limitation, symbols can also be converted in random order. In other words, the data string is not limited to successive symbols only.

The left side of the conversion table represents pre-encoding status, and the right side of the conversion table represents the post-encoding status. For example, if the symbol P has "01" and the current control value CV records a value equal to 0, the code word corresponding to the symbol P is "010", and the control CV keeps its original value 0. However, if the symbol P has "01" and the current control value CV records a value equal to 2, the code word corresponding to the symbol P is "100", and the control CV is updated to record a value equal to 0.

As mentioned above, each symbol P, Q, R has two bits. Therefore, each symbol P, Q, R can be: "00", "01", "10", or "11". In addition, the control value CV used in the encoding process has four possible values: 0, 1, 2, and 3. To provide a clear description of the encoding operation performed by the conversing unit 104, some specific notations are used in the following paragraphs. If the control value CV stores a value equaling 0, $CV_0$ stands for "1"; otherwise, $CV_0$ stands for "0". If the control value CV stores a value equaling 1, $CV_1$ stands for "1"; otherwise, $CV_1$ stands for "0". If the control value CV stores a value equaling 2, $CV_2$ stands for "1"; otherwise, $CV_2$ stands for "0". If the control value CV stores a value equaling 3, $CV_3$ stands for "1"; otherwise, $CV_3$ stands for "0". As to the symbol P, if the symbol P is "00", $P_0$ stands for "1"; otherwise, $P_0$ stands for "0". If the symbol P is "01", $P_1$ stands for "1"; otherwise, $P_1$ stands for "0". If the symbol P is "10", $P_2$ stands for "1"; otherwise, $P_2$ stands for "0". If the symbol P is "11", $P_3$ stands for "1"; otherwise, $P_3$ stands for "0". The above notation rule for symbol P is applied in the same way to the other symbols Q and R.

Referring to the conversion table shown in FIG. 1, bit $X_1$ of the generated code word corresponding to the symbol P is set to the value "1" only when one of the following conditions is "true".

Condition (1): CV=0 & P="11"
Condition (2): CV=1 & P="00"
Condition (3): CV=1 & P="01"
Condition (4): CV=1 & P="11"
Condition (5): CV=2 & P="01"
Condition (6): CV=2 & P="11"
Condition (7): CV=2 & P="10" & Q="00"
Condition (8): CV=2 & P="00" & Q="00"
Condition (9): CV=3 & P="00"

Therefore, based on the above conditions, the modulation rule for $X_1$ is derived and expressed as follows:

$$X_1 = CV_3 + CV_2 \& (P_0 \& Q_0 + P_2 \& Q_0 + P_1 + P_3) + CV_1 \& (P_0 + P_1 + P_3) + CV_0 \& P_3 \quad \text{Equation (1)}$$

Similarly, the modulation rules for the other bits $X_2$ and $X_3$ are easily derived and expressed as follows:

$$X_2 = CV_0 \& (P_1 + P_0 (Q_2 + Q_3 + Q_0 (R_0 + R_1))) \quad \text{Equation (2)}$$

$$X_3 = CV_0 \& (P_2 + P_3) \quad \text{Equation (3)}$$

Please note, in Equations (1) through (3), the symbol "&" represents a logic AND operator and the symbol "+" represents a logic OR operator. This same notation will appear in following equations as well.

Assume that the symbol P always consists of a fixed length of 2-bits that are referred to as $Z_1$ and $Z_2$. $Z_1$ is the left-most bit while $Z_2$ is the right-most bit. Similarly, assume that the symbol Q also contains 2-bits and that these two bits are referred to as $Z_3$ (the left most bit of Q) and $Z_4$ (the right most bit of Q); and the symbol R contains 2-bits that are referred to as $Z_5$ (the left most bit of R) and $Z_6$ (the right most bit of R). Therefore, the sequence of symbols (P, Q, R) can also be represented as a bit sequence: $(Z_1, Z_2, Z_3, Z_4, Z_5, Z_6)$. In addition, Z' is the notation that is used to represent an inverse of Z. For instance, $Z_1'$ represents "1" when $Z_1$ is "0".

Each of the equations (1), (2), and (3) can be further reduced to form the following equivalent and simplified equations (4), (5), and (6) as shown below ("&" represents a logic AND operator and "+" represents a logic OR operator):

$$X_1 = CV_3 + CV_2 \& (Z_3' \& Z_4' + Z_2) + CV_1 \& (Z_1' + Z_2) + CV_0 \& (Z_1 Z_2) \quad \text{Equation (4)}$$

$$X_2 = CV_0 \& (Z_1' \& (Z_2 + (Z_3 + Z_4 Z_5'))) \quad \text{Equation (5)}$$

$$X_3 = CV_0 \& (Z_1) \quad \text{Equation (6)}$$

As mentioned previously, the control value CV may or may not be updated after each active symbol is encoded into a code word. Following the above-mentioned equation derivation, the determination of the value of control value CV after the symbol P has been encoded follows from the below equation (Please note, in equation (7) the symbol "*" represents the base 10 multiplication operator and the symbol "+" represents the base 10 addition operator):

$$CV = a_0 * 0 + a_1 * 1 + a_2 * 2 + a_3 * 3 = CV_0 * 0 + CV_1 * 1 + CV_2 * 2 + CV_3 * 3 \quad \text{Equation (7)}$$

In Equation (7), the parameters $a_0$ through $a_3$ are determined by the following equations ("&" represents a logic AND operator and "+" represents a logic OR operator):

$$CV_0 = (CV_0 + CV_1) \& (Z_1 + Z_2) + CV_2 \& (Z_2 + Z_3 + Z_4) + CV_3 \quad \text{Equation (8)}$$

$$CV_1 = CV_0 \& (Z_1' \& Z_2') \quad \text{Equation (9)}$$

$$CV_2 = CV_1 \& (Z_1' \& Z_2') \quad \text{Equation (10)}$$

$$CV_3 = CV_2 \& (Z_2' \& Z_3' \& Z_4') \quad \text{Equation (11)}$$

As long as the contents of the bits $Z_1$ through $Z_6$ and the current control value CV are known, the converting unit 104 easily and quickly determines each bit $X_1$, $X_2$, $X_3$ of the code word and updates the value of the control value CV by utilizing the above Equations (4) through (11). The updated control value CV controls the encoding operation for the next unprocessed symbol Q that will shift over taking the place of the currently processed symbol P.

Figure 5:
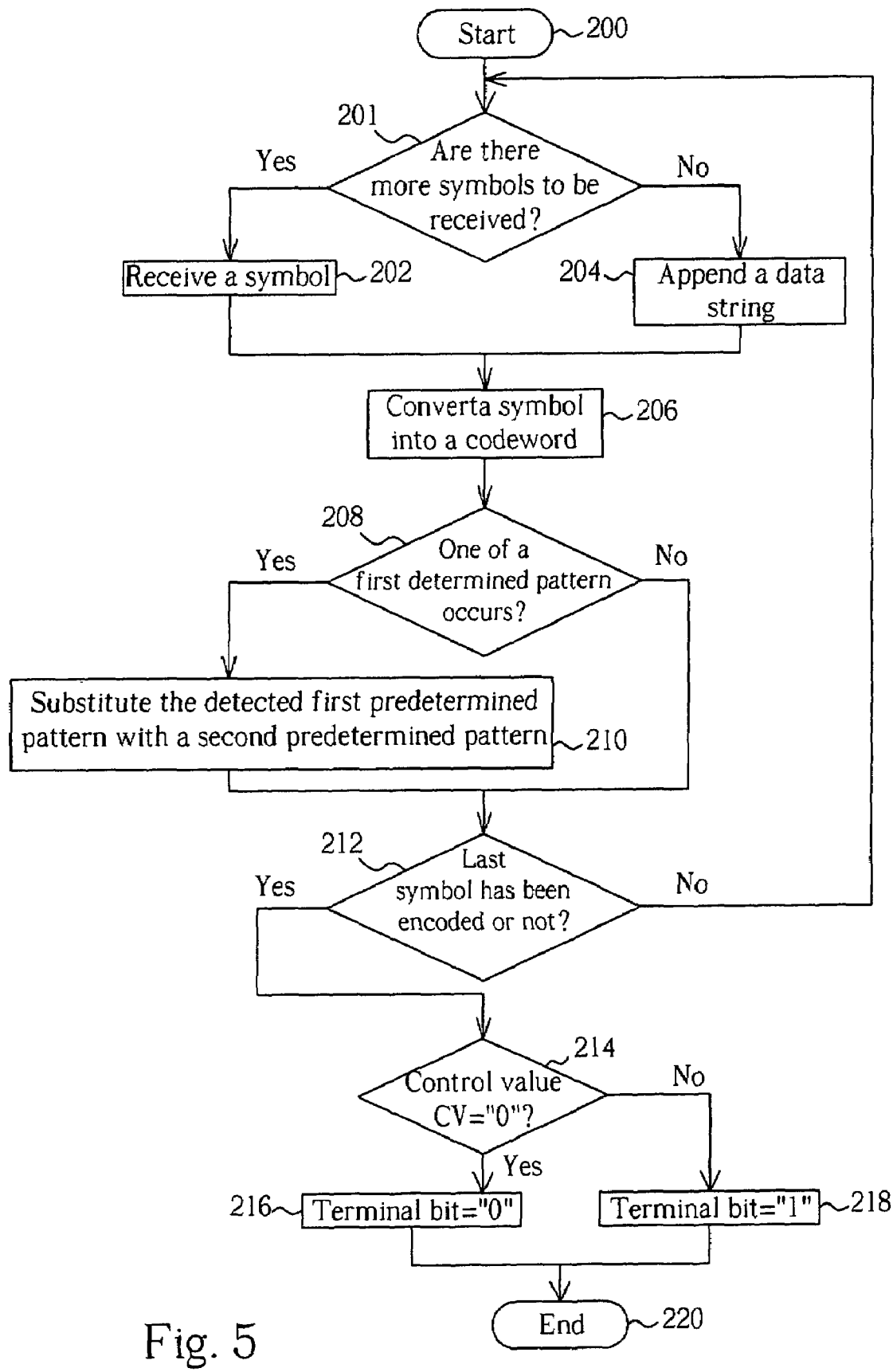
FIG. 5 is a flowchart illustrating the operation of the modulation apparatus shown in FIG. 3.

Please refer to FIG. 5 in conjunction with FIG. 3. FIG. 5 is a flowchart illustrating the operation of the modulation apparatus 100 shown in FIG. 3. The modulation apparatus 100 encodes the data word sequence DW into a desired code word sequence CW through following steps:

Step 200: Start.

Step 201: Are there more symbols to be received? If yes, go to step 202. If no, go to step 204.

Step 202: The modulation apparatus 100 receives the data word sequence DW as a series of symbols to be encoded to the code word sequence CW sandwiched by two synchronization patterns;

Step 204: The appending unit 102 appends a data string, such as: 0101, to the data word sequence DW.

Step 206: The converting unit 104 converts one of the unprocessed symbols in the data word sequence DW into a code word according to the Equations (4) through (11).

Step 208: The identifying unit checks if one of the following first predetermined patterns, such as "101 010 101 010" and "xx1 101" (x can be 0 or 1), occurs. If yes, go to step 210; otherwise, go to step 212.

Step 210: The substituting unit 108 substitutes a first predetermined pattern detected by the identifying unit 106 with a second predetermined pattern. For example, "101 010 101 010" is replaced with "001 000 00 010" and "xx1 101" is replaced with "xx1 000". Go to step 212.

Step 212: Has a last symbol of the data word sequence DW been converted by the converting unit 104? If yes, go to step 214; otherwise, go to step 201.

Step 214: Is the control value CV equal to 0? If yes, go to step 216; otherwise, go to step 218.

Step 216: The determining unit 110 sets the first bit (i.e., the terminal bit) of the synchronization pattern to the value 0.

Step 218: The determining unit 110 sets the first bit (i.e., the terminal bit) of the synchronization pattern to the value 1.

Step 220: End.

Please note that the converting unit 104 with respect to step 206 can convert the data sequence at any time, even before all the data sequence DW has been received, or before the appending process is completed.

In this embodiment, the new conversion table shown in FIG. 4 is used in place of the conventional conversion table. As previously mentioned, the conventional conversion table for encoding contains codes for basic encoding, substitution codes, and termination codes. However, the new conversion table shown in FIG. 4 does not utilize all of the encoding rules listed on the conventional conversion table. Therefore, the identifying unit 106, the substituting unit 108, and the determining unit 110 cooperate with the converting unit 104 to compensate the output of the modulation apparatus 100 for the unutilized encoding rules. That is, by the application of the steps 208, 210, 214, 216, and 218, the encoded data outputted from the modulation apparatus 100 fully comply with the 17PP-coding scheme coding specification. In addition, as mentioned above, the modulation apparatus 100 is capable of applying a "fixed-length data in, fixed-length data out" coding scheme to the received data word sequence. Therefore, the computational complexity is greatly reduced and the encoding performance is significantly increased.

Figure 6:
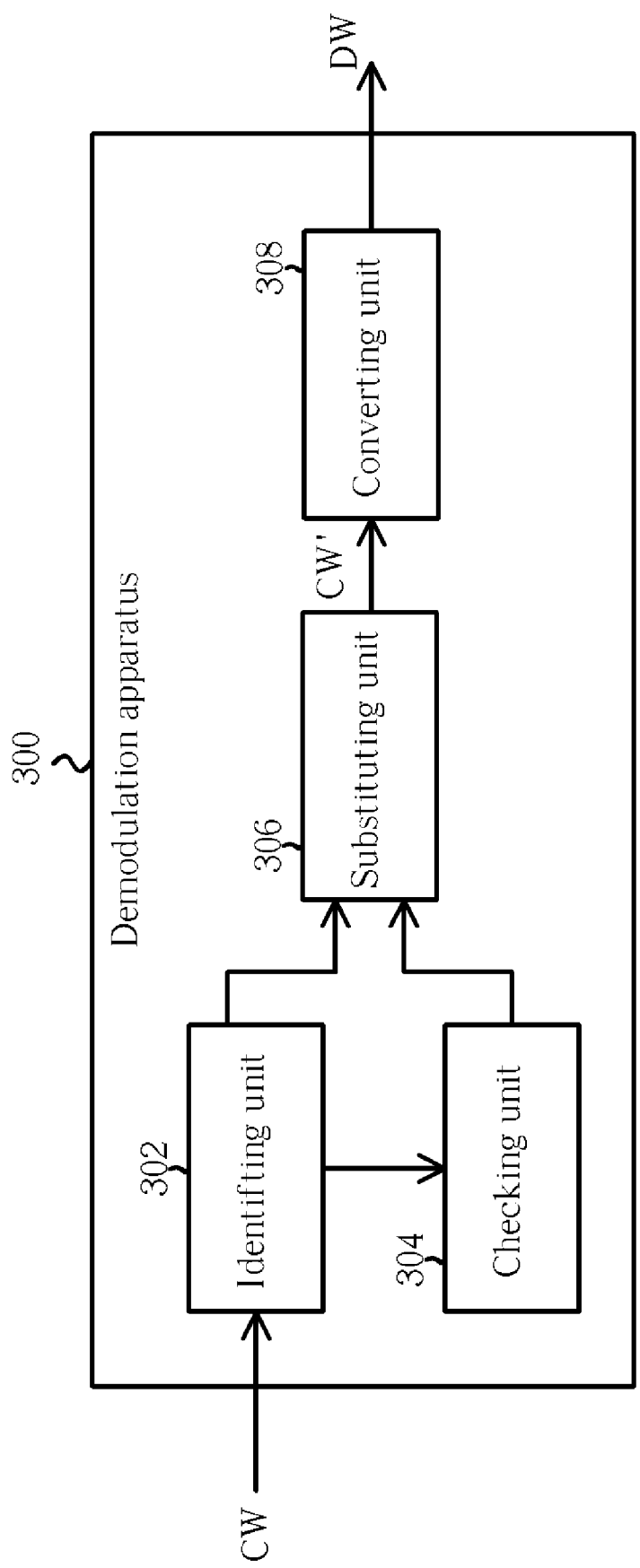
FIG. 6 is a block diagram of a demodulation apparatus according to a second embodiment of the present invention.

Please refer to FIG. 6. FIG. 6 is a block diagram of a demodulation apparatus 300 according to a second embodiment of the present invention. The demodulation apparatus 300 has an identifying unit 302, a checking unit 304, a substituting unit 306, and a converting unit 308. The identifying unit 302 is used for identifying a plurality of code words in the code word stream CW disposed between two synchronization patterns. In some cases, the identifying unit 302 could be a counter. The checking unit 304 is used for checking if the first bit (i.e., the terminal bit) of the synchronization pattern following the code word sequence CW is "1". Please note that the first bit is used as an example and is not intended as a limitation. A plurality of selected bits can be used by the checking unit 304. The substituting unit 306 is used for substituting first three bits in the synchronization pattern with "100" if the checking unit 304 detects that the first bit of the checked synchronization pattern matches "1". In addition, the identifying unit 302 further identifies a first predetermined pattern, "001 000 000 010", in the code word sequence CW, and then the substituting unit 306 substitutes the first predetermined pattern, "001 000 000 010", with a second predetermined pattern, "101 010 101 010". The substituting unit 306 then outputs the modified code word sequence CW' to the following converting unit 308. The converting unit 308 converts each of the incoming code words into a symbol according to the predetermined demodulation rules and a code word set selected from the code word sequence. In this embodiment, each code word has three bits, each symbol has two bits, and each code word set has five code words.

Please refer to FIG. 7. FIG. 7 is an inverse conversion table for decoding according to an embodiment of the present invention. Based on this table, the converting unit 308 follows the predetermined demodulation rules to perform the decoding operation. The following describes the notation utilized by said inverse conversion table. A complete understanding of this notation is needed before presenting an example of code word to data word decoding. The decoding table notation is as follows. A symbol 100 shown in underscore notation represents symbols that are not equal to 100. In other words, 100 shown in underscore notation can be any one of the following: 000, 001, 010, 011, 101, 110, or 111. Symbols A, B, C, D, and E are each 3-bit code words successively transmitted to the converting unit 308. Each of these code words A, B, C, D, and E is to be decoded into a 2-bit data word. Taking the symbol C for example, it is decoded into a data word having two bits $M_1$ and $M_2$. Furthermore, the symbol C is considered the active target symbol that is currently being decoded. That is, as the converting unit 308 is processing the symbol C, the previous two symbols A, B and the following two symbols D, E are referenced. Once the decoding of symbol C is completed, and then symbols D and E shift their positions in the code word sequence CW' such that unprocessed symbols D and E shift into new positions to be unprocessed symbols C and D. The next new unprocessed symbol in the code word sequence CW' occupies the position for symbol E.

The left side of the inverse conversion table represents pre-decoding status, and the right side of the inverse conversion table represents the post-decoding status. For example, if the symbol C has "010" and the following symbol D has "101, the data word corresponding to the symbol C is "01".

As mentioned above, each symbol (code word) A, B, C, D, E has three bits. Therefore, based on 17PP coding specification, each symbol A, B, C, D, E can be: "000", "100", "010", "001" or "101". For clear description of the encoding operation performed by the conversing unit 104, some specific notations are used in the following paragraphs. If the symbol A is "000", $A_0$ stands for "1"; otherwise, $A_0$ stands for "0". If the symbol A is "100", $A_1$ stands for "1"; otherwise, $A_1$ stands for "0". If the symbol A is "010", $A_2$ stands for "1"; otherwise, $A_2$ stands for "0". If the symbol A is "001", $A_3$ stands for "1"; otherwise, $A_3$ stands for "0". If the symbol A is "101", $A_4$ stands for "1"; otherwise, $A_4$ stands for "0". The above notation rule for symbol A is applied to other symbols B through E.

Assume that the symbol A always consists of a fixed length of 3-bits that are referred to as $X_1$, $X_2$ and $X_3$. $X_1$ is the left-most bit, $X_2$ is the middle bit, and $X_3$ is the right-most bit. Similarly, assume that the symbol B always consists of a fixed length of 3-bits that are referred to as $X_4$ (the left-most bit), $X_5$ (the middle bit) and $X_6$ (the right-most bit); the symbol C always consists of a fixed length of 3-bits that are referred to as $X_7$ (the left-most bit), $X_8$ (the middle bit) and $X_9$ (the right-most bit); the symbol D always consists of a fixed length of 3-bits that are referred to as $X_{10}$ (the left-most bit), $X_{11}$ (the middle bit) and $X_{12}$ (the right-most bit); and the symbol E always consists of a fixed length of 3-bits that are referred to as $X_{13}$ (the left-most bit), $X_{14}$ (the middle bit) and $X_{15}$ (the right-most bit). Therefore, the sequence of symbols (A, B, C, D, E) can also be represented as a bit sequence ($X_1$, $X_2$, $X_3$, $X_4$, $X_5$, $X_6$, $X_7$, $X_8$, $X_9$, $X_{10}$, $X_{11}$, $X_{12}$, $X_{13}$, $X_{14}$, $X_{15}$). In addition, X' means an inverse of X. For instance, $X_1'$ represents "1" when $X_1$ is "0".

Referring to the inverse conversion table shown in FIG. 7 in conjunction with the above-mentioned equation derivation means, the demodulation rules for $M_1$ and $M_2$ are easily derived and expressed as follows:

$$M_1 = X_9 + (X_7 \& m_1) + f_1 \& (X_8' \& (X_6 + X_5 + m_1) + (X_7 \& X_5)) \quad \text{Equation (12)}$$

$$M_2 = f_1 \& (X_8 + (X_9' \& X_6)) + X_7 \& (X_9 + f_1 \& (X_4' + X_1')) \quad \text{Equation (13)}$$

In above Equations (12) and (13), f1 and m1 are as follows:

$$f1 = X_{11} + X_{12} + (X_{10}' \& X_{13} \& X_{15}') \quad \text{Equation (14)}$$

$$m1 = X_1' \& X_2' \& X_4 \quad \text{Equation (15)}$$

Please note, in Equations (12) through (15), "&" represents a logic AND operator and "+" represents a logic OR operator.

Figure 8:
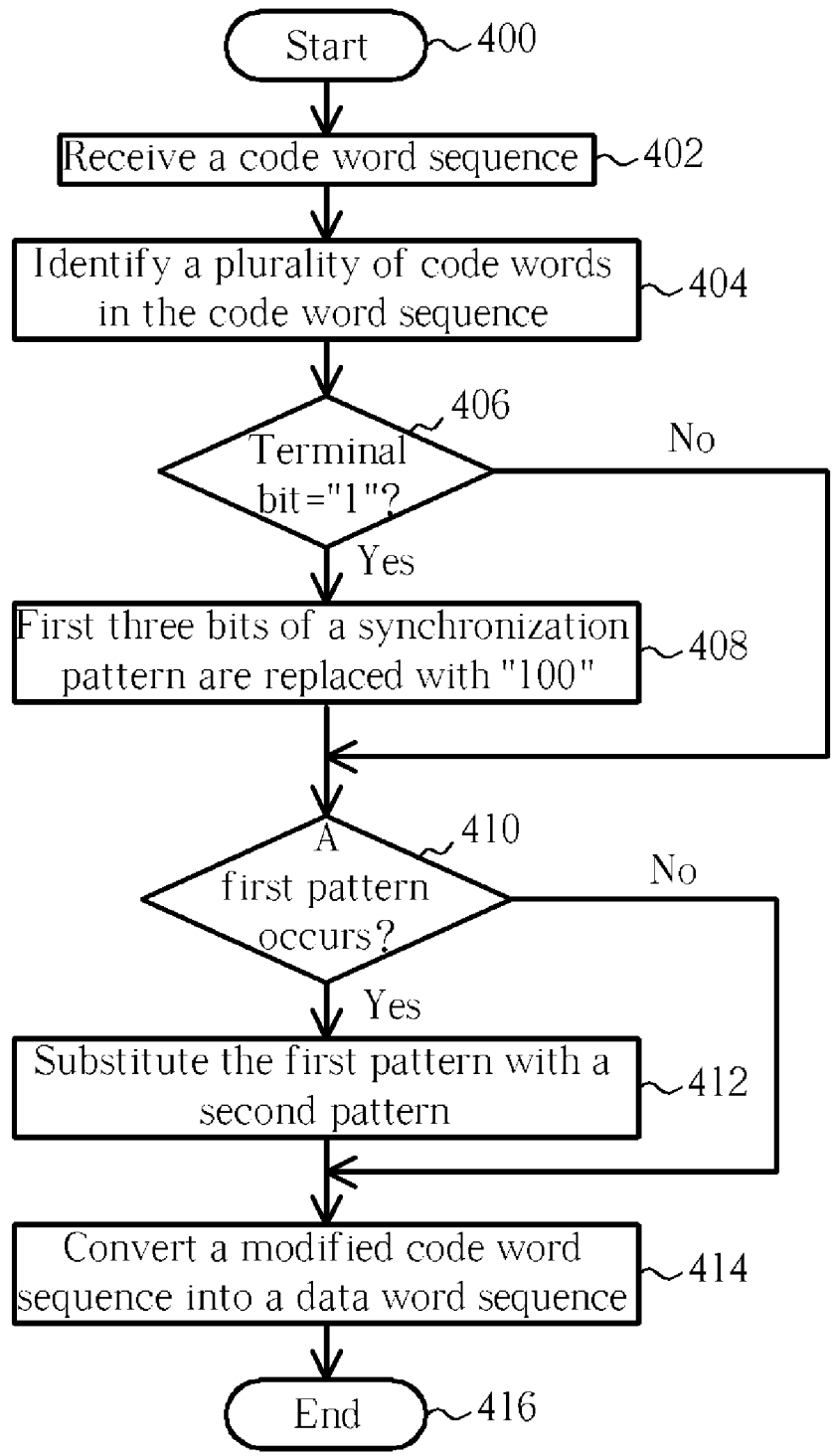
FIG. 8 is a flowchart illustrating the operation of the demodulation apparatus shown in FIG. 6.

As long as the contents of the bits $X_1$ through $X_{15}$ are known, the converting unit 308 can easily and quickly determine each bit $M_1$, $M_2$ of the data word corresponding to the active code word, symbol C, by utilizing the above Equations (12) through (15). Please refer to FIG. 8 in conjunction with FIG. 6. FIG. 8 is a flowchart illustrating the operation of the demodulation apparatus 300 shown in FIG. 6. The demodulation apparatus 300 decodes the code word sequence CW to a desired data word sequence DW through following steps.

Step 400: Start.

Step 402: The demodulation apparatus 300 receives the code word sequence CW, sandwiched by two synchronization patterns, to be decoded to the data word sequence DW;

Step 404: The identifying unit 302 identifies a plurality of code words in the code word sequence CW.

Step 406: The checking unit 304 checks if the first bit (i.e., terminal bit) of the synchronization pattern following the code word sequence CW is "1". If yes, go to step 408; otherwise, go to step 410.

Step 408: The substituting unit 306 substitutes the first three bits in the synchronization pattern with "100".

Step 410: The identifying unit 302 checks if a first predetermined pattern, "001 000 000 010", exists in the code word sequence CW. If yes, go to step 412; otherwise, go to step 414.

Step 412: The substituting unit 306 substitutes the first predetermined pattern, "001 000 000 010", with a second predetermined pattern, "101 010 101 010".

Step 414: The converting unit 308 converts each of the incoming code words carried transmitted via the modified code word sequence CW' into a data word according to Equations (12) through (15).

Step 416: End.

In this embodiment, the new inverse conversion table shown in FIG. 7 is used to take place of the conventional inverse conversion table shown in FIG. 2. However, the new inverse conversion table shown in FIG. 4 does not cover all of the decoding rules listed on the conventional inverse conversion table. Therefore, the identifying unit 302, the substituting unit 306 and the checking unit 304 cooperate with the converting unit 308 to compensate the output of the demodulation apparatus 300 for the missing decoding rules. That is, by applying the steps 406 through 412, the decoded data outputted from the demodulation apparatus 300 fully comply with the 17PP-coding scheme decoding specification. In addition, as mentioned above, the demodulation apparatus 300 is capable of applying a "fixed-length data in, fixed-length data out" decoding scheme to the received code word sequence. Therefore, the computational complexity is greatly reduced and the encoding performance is significantly increased.

In the above second embodiment, step 412 is used for recovering desired data words. However, in other embodiments of the present invention, the substitution procedure can be integrated into the conversion procedure if proper demodulation rules are provided. Additionally, the data words to be recovered from the code word stream may have been generated by a predetermined encoding process, which comprises the substitution process.

Please refer to FIG. 9, which is an inverse conversion table for decoding according to another embodiment of the present invention. Based on this table, the converting unit 308 follows corresponding predetermined demodulation rules, different from that defined by the table shown in FIG. 7, to perform the decoding operation. Using the same notation rules utilized by said inverse conversion table shown in FIG. 7, symbols A, B, C, D, and E are each 3-bit code words successively transmitted to the converting unit 308. In addition, the symbol A always consists of a fixed length of 3-bits that are referred to as $X_1$ (left-most bit), $X_2$ (middle bit) and $X_3$ (right-most bit); the symbol B always consists of a fixed length of 3-bits that are referred to as $X_4$ (the left-most bit), $X_5$ (the middle bit) and $X_6$ (the right-most bit); the symbol C always consists of a fixed length of 3-bits that are referred to as $X_7$ (the left-most bit), $X_8$ (the middle bit) and $X_9$ (the right-most bit); the symbol D always consists of a fixed length of 3-bits that are referred to as $X_{10}$ (the left-most bit), $X_{11}$ (the middle bit) and $X_{12}$ (the right-most bit); the symbol E always consists of a fixed length of 3-bits that are referred to as $X_{13}$ (the left-most bit), $X_{14}$ (the middle bit) and $X_{15}$ (the right-most bit); and the symbol F always consists of a fixed length of 3-bits that are referred to as $X_{16}$ (the left-most bit), $X_{17}$ (the middle bit) and $X_{18}$ (the right-most bit).

Furthermore, the symbol C is considered the active target symbol that is currently being decoded. That is, as the converting unit 308 is processing the symbol C, previous two symbols A, B and following three symbols D, E, and F are referenced. Following the above-mentioned equation derivation means, the demodulation rules for $M_1$ and $M_2$ are easily derived and expressed as follows:

$$M_1 = (X9 + X7 \& m1 + f1 \& (X8' \& (X6 + X5 + m1) + (X7 \& X5))) \& g_{d2}' + g_{d3} \quad \text{Equation (16)}$$

$$M_2 = f1 \& (X8 + X9' \& X6) + X7 \& (X9 + f1 \& (X4' + X1')) \quad \text{Equation (17)}$$

In above Equations (16) and (17), $f_1$, $m_1$, $g_{d1}$, $g_{d2}$, $g_{d3}$ are as follows:

$$f1 = X_{11} + X_{12} + (X_{10}' \& X_{13} \& X_{15}') \quad \text{Equation (18)}$$

$$m1 = X_1' \& X_2' \& X_4 \quad \text{Equation (19)}$$

$$g_{d1} = X_7' \& X_8' \& X_9 \& X_{10}' \& X_{11}' \& X_{12}' \& X_{13}' \& X_{14}' \& X_{15}' \& X_{16}' \& X_{17}' \& X_{18}' \quad \text{Equation (20)}$$

$$g_{d2} = X_4' \& X_5' \& X_6 \& X_7' \& X_8' \& X_9' \& X_{10}' \& X_{11}' \& X_{12}' \& X_{13}' \& X_{14} \& X_{15}' \quad \text{Equation (21)}$$

$$g_{d3} = X_1' \& X_2' \& X_3 \& X_4' \& X_5' \& X_6' \& X_7' \& X_8' \& X_9' \& X_{10}' \& X_{11} \& X_{12}' \quad \text{Equation (22)}$$

Please note, in Equations (16) through (22), "&" represents a logic AND operator and "+" represents a logic OR operator.

As long as the contents of the bits $X_1$ through $X_{18}$ are known, the converting unit 308 can easily and quickly determine each bit $M_1$, $M_2$ of the data word corresponding to the active code word, symbol C, by utilizing the above Equations (16) through (22). In addition, the steps 410 and 412 are removed when applying the decoding scheme referring to the inverse conversion table shown in FIG. 9.

If the code words are generated according to the 17PP-coding scheme, Equation (20), Equation (21) and Equation (22) could be further simplified to Equation (23), Equation (24) and Equation (25) listed as follows:

$$g_{d1} = X_7' \& X_9 \& X_{11}' \& X_{12}' \& X_{13}' \& X_{14}' \& X_{15}' \& X_{17} \quad \text{Equation (23)}$$

$$g_{d2} = X_4' \& X_6 \& X_8' \& X_9' \& X_{10}' \& X_{11}' \& X_{12}' \& X_{14} \quad \text{Equation (24)}$$

$$g_{d3} = X_1' \& X_3 \& X_5' \& X_6' \& X_7' \& X_8' \& X_9' \& X_{11} \quad \text{Equation (25)}$$

In contrast to the related art, the modulation/demodulation method and apparatus adopts a "fixed-length data in, fixed-length data out" scheme to encode/decode the incoming data word sequence/code word sequence. Therefore, for 17PP-encoding/decoding, the computational complexity is greatly reduced and the encoding performance is significantly increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A modulation method for a first data string, wherein the first data string having a plurality of symbols; the modulation method comprising:

(a) appending a data string to the first data string to form a second data string;

(b) converting the second data string to a code word sequence by converting each of the symbols in the first data string to a code word according to at least one predetermined modulation rule and a symbol set selected from the second data string, wherein each code word has a first fixed number of bits, each symbol has a second fixed number of bits, and each symbol set has a fixed number of symbols;

(c) identifying a first predetermined pattern; and (d) substituting the first predetermined pattern with a second predetermined pattern.

2. The modulation method of claim 1, wherein the first predetermined pattern is in the codeword.

3. The modulation method of claim 1 further comprising:
identifying a first predetermined pattern in the code words; and
substituting the first predetermined pattern with a second predetermined pattern.

4. The modulation method of claim 1, wherein step (b) further comprises:
converting each of the symbols in the first data string according to a control value and the predetermined modulation rules; and
after each symbol is converted, updating the control value according to the predetermined modulation rules.

5. The modulation method of claim 1, wherein each code word complies with a Blu-ray disc format specification.

6. The modulation method of claim 4, further comprising:
when a last symbol of the first data string has been converted, determining a predetermined portion of a synchronization pattern according to the control value.

7. A demodulation method for a code word stream, wherein the code word stream is disposed between a first synchronization pattern and a second synchronization pattern, the demodulation method comprising:
identifying a plurality of code words in the code word stream; and
converting each of the code words to a symbol according to at least one predetermined demodulation rules and a code word set selected from the code word stream, wherein each code word has a first fixed number of bits, each symbol has a second fixed number of bits, and each code word set has a fixed number of code words, wherein the code word stream is generated by a predetermined encoding process.

8. The demodulation method of claim 7, further comprising:
identifying a first predetermined pattern in the code word stream; and
substituting the first predetermined pattern with a second predetermined pattern.

9. The demodulation method of claim 7, wherein each of the code words complies with a Blu-ray disc format specification.

10. The demodulation method of claim 7, further comprising:
checking if a predetermined portion of the second synchronization pattern matches a predetermined form, and if the predetermined portion of the second synchronization pattern matches the predetermined form, substituting a plurality of selected bits in the second synchronization pattern with a plurality of predetermined bits.

11. The demodulation method of claim 7, further comprising:
modifying the bits of the first or second synchronization patterns before the substitution process.

12. The demodulation method of claim 7, further comprising:
modifying the bits of the first or second synchronization patterns after the substitution process.

13. The demodulation method of claim 10, wherein the selected bits substituted with the predetermined bits corresponds to the bits in the beginning portion of the second synchronization pattern.

14. A modulation apparatus for a first data string, wherein the first data string having a plurality of symbols; the modulation apparatus comprising:
an appending unit for appending a data string to the first data string to form a second data string; and
a converting unit coupled to the appending unit for converting the second data string to a code word sequence by converting each of the symbols in the first data string into a code word according to at least one predetermined modulation rules and a symbol set selected from the second data string, wherein each code word has a first fixed number of bits, each symbol has a second fixed number of bits, and each symbol set has a fixed number of symbols.

15. The modulation apparatus of claim 14, further comprising:
an identifying unit coupled to the converting unit for identifying a first predetermined pattern in the code words; and
a substituting unit coupled to the identifying unit and the converting unit for substituting the first predetermined pattern with a second predetermined pattern.

16. The modulation apparatus of claim 14, wherein the converting unit converts each of the symbols in the first data string according to a control value and the predetermined modulation rules; and after each symbol is converted, the converting unit updates the control value according to the predetermined modulation rules.

17. The modulation apparatus of claim 14, wherein each code word complies with a Blu-ray disc format specification.

18. The modulation apparatus of claim 14, further comprising:
a determining unit coupled to the converting unit for determining a predetermined portion of a synchronization pattern according to the control value when a last symbol of the first data string has been converted.

19. A demodulation apparatus for a code word stream, wherein the code word stream is disposed between a first synchronization pattern and a second synchronization pattern; the demodulation apparatus comprising:
an identifying unit for identifying a plurality of code words in the code word stream; and
a converting unit coupled to the identifying unit for converting each of the code words into a symbol according to at least one predetermined demodulation rule and a code word set selected from the code word stream, wherein each code word has a first fixed number of bits, each symbol has a second fixed number of bits, and each code word set has a fixed number of code words, wherein the code word stream is generated by a predetermined encoding process.

20. The demodulation apparatus of claim 19, wherein the identifying unit further identifies a first predetermined pattern in the code word stream; and the demodulation apparatus further comprises:
a substituting unit coupled to the identifying unit for substituting the first predetermined pattern with a second predetermined pattern.

21. The demodulation apparatus of claim 19, wherein each of the code words complies with a Blu-ray disc format specification.

22. The demodulation apparatus of claim 19, further comprising:
a checking unit coupled to the identifying unit for checking if a predetermined portion of the second synchronization pattern matches a predetermined form; and a substituting unit coupled to the checking unit for substituting a plurality of selected bits in the second synchronization pattern with a plurality of predetermined bits if the checking unit detects that the predetermined portion of the second synchronization pattern matches the predetermined form.

23. The demodulation apparatus of claim 22, wherein the selected bits substituted with the predetermined bits correspond to the bits in the beginning portion of the second synchronization pattern.

* * * * *